(12) United States Patent
Slager

(10) Patent No.: US 6,399,004 B1
(45) Date of Patent: Jun. 4, 2002

(54) METHOD FOR ENCAPSULATING A CHIP ON A CARRIER

(75) Inventor: Benjamin Slager, Ewijk (NL)

(73) Assignee: Nedcard B.V., Nijmegan (NL)

( * ) Notice: Subject to any disclaimer, the term of this patent is extended or adjusted under 35 U.S.C. 154(b) by 0 days.

(21) Appl. No.: 09/319,004

(22) PCT Filed: Nov. 27, 1997

(86) PCT No.: PCT/NL97/00651

§ 371 (c)(1),
(2), (4) Date: Oct. 1, 1999

(87) PCT Pub. No.: WO98/23427

PCT Pub. Date: Jun. 4, 1998

(30) Foreign Application Priority Data

Nov. 29, 1996 (NL) .............................................. 1004651

(51) Int. Cl.[7] .......................... B29C 45/07; B29C 45/14; B29C 70/74
(52) U.S. Cl. ................... 264/254; 264/255; 264/272.15; 264/272.17; 29/841
(58) Field of Search ................................ 264/254, 255, 264/272.11, 272.15, 272.17; 29/825, 855, 832, 841

(56) References Cited

U.S. PATENT DOCUMENTS

| | | | | |
|---|---|---|---|---|
| 3,501,833 A | * | 3/1970 | Spiegler ...................... | 29/627 |
| 3,622,419 A | * | 11/1971 | Tempe ......................... | 156/242 |
| 3,668,299 A | * | 6/1972 | McNeal ................. | 264/272.11 |
| 4,567,006 A | * | 1/1986 | Covington et al. .... | 264/272.16 |
| 4,812,421 A | * | 3/1989 | Jung et al. ............. | 264/272.11 |
| 4,835,120 A | * | 5/1989 | Mallik et al. ................ | 437/209 |
| 4,961,886 A | | 10/1990 | Eckstein et al. | |
| 5,049,526 A | * | 9/1991 | McShane et al. ............ | 437/211 |
| 5,344,600 A | * | 9/1994 | McShane et al. ...... | 264/272.17 |
| 5,577,319 A | * | 11/1996 | Knecht .................. | 264/272.17 |

FOREIGN PATENT DOCUMENTS

| | | | |
|---|---|---|---|
| EP | 0319175 | 6/1989 | |
| JP | 1-128438 | * 5/1989 | ............ 264/272.17 |
| JP | 3-257938 | * 11/1991 | ............ 264/272.17 |

OTHER PUBLICATIONS

Patent Abstracts of Japan, vol. 017, No. 128 (E–1333), Mar. 18, 1993, (JP 04 302457 A).
Patent Abstracts of Japan, vol. 017, No. 128 (E–1333), Mar. 18, 1993, (JP 04 030989 A).
Patent Abstracts of Japan, vol. 010, No. 283 (E–440), Sep. 26, 1986, (JP 61 101054 A).
Patent Abstracts of Japan, vol. 014, No. 387 (E–0967), Aug. 21, 1990, (JP 02 143436 A).
Patent Abstracts of Japan, vol. 016, No. 538 (M–1335), Nov. 9, 1992, (JP 04 201576 A).
Patent Abstracts of Japan, vol. 013, No. 150 (E–742), Apr. 12, 1989, (JP 63 310140 A).

* cited by examiner

Primary Examiner—Angela Ortiz
(74) Attorney, Agent, or Firm—Handal & Morofsky

(57) ABSTRACT

Method for encapsulating a chip (10) on a carrier (12) whereby the chip (10) is positioned on the carrier (12), a dam (16a, 16b) is formed on the carrier (12) around the chip (10), encapsulating material (18) is poured into the space within the dam (16a, 16b), and the obtained encapsulated structure is cured. In a first separate step on the carrier only the dam (16a, 16b) is formed from a thermohardening material at a relatively high temperature and is cured at least partly and in a succeeding second step the space within the dam is filled with the same thermohardening material at a relatively low temperature.

15 Claims, 1 Drawing Sheet

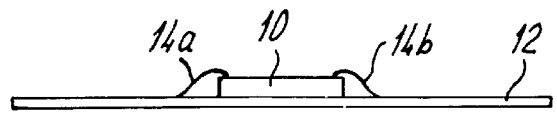
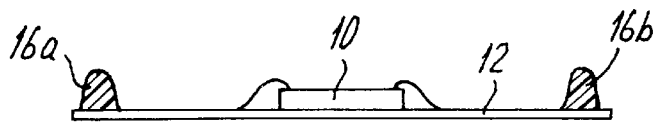
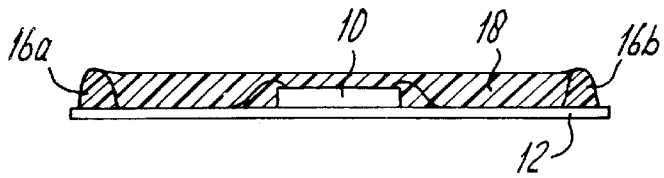
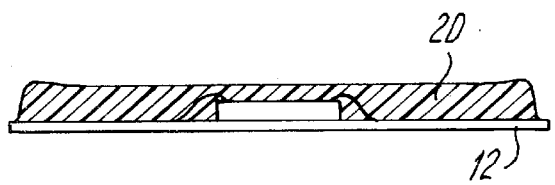
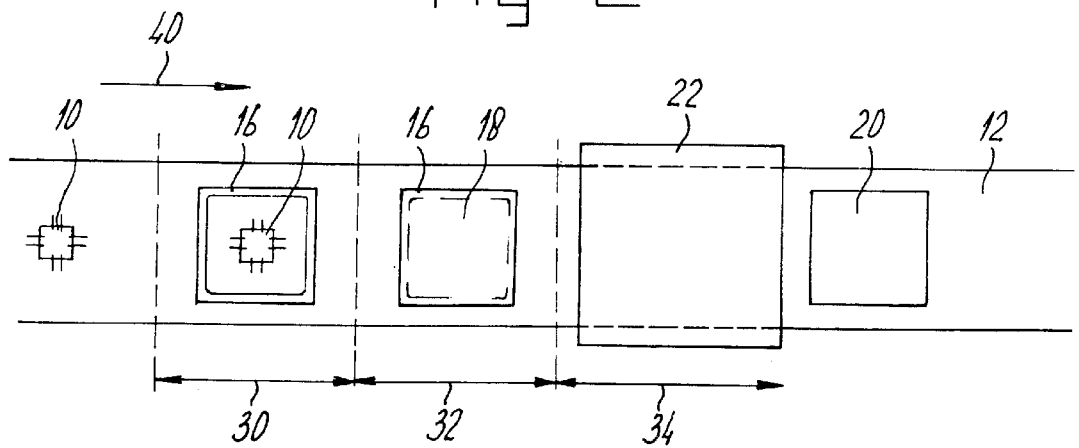

METHOD FOR ENCAPSULATING A CHIP ON A CARRIER

BACKGROUND OF THE INVENTION

The invention relates to a method for encapsulating a chip on a carrier whereby.

the chip is positioned on the carrier a dam is formed on the carrier around the chip encapsulating material is poured into the space within the dam the obtained encapsulated structure is cured.

A prior art method of this type is described in JP-04302457. According to this method the dam is a pre-manufactured separate framework which is positioned on the carrier such that it surrounds the chip and is adhered to the carrier by means of an adhesive. Thereafter the encapsulating material is poured into the space within the dam. Premanufacturing, storing and handling of the frameworks is considered expensive and laborious. The premanufacturing process and the encapsulating process are carried out separately and in different processing stations. All this is considered as a serious disadvantage of this method.

Also JP-61101054 obviously describes the use of a pre-manufactured dam comprising two sections, one sections made of a thermosetting resin melting at high temperature and the second section made of a thermosetting resin melting at low temperature. The second section functions as an adhesive element for positioning and fixing both sections to the substrate after which the encapsulating material is poured into the space within the dam. This method has the same disadvantages as remarked in the preceding paragraph.

In JP 04303989 a method is described for reducing solder areas by forming a dam around the solder areas. On a substrate a lower conductor layer is formed. Where necessary insulating material is applied and thereafter an upper conductor layer is formed. Together with the. upper conductors locally dams are formed on the lower conductors to mark out the restricted soldering areas. The upper. conductors and the dams are constituted as printed layers by applying a suitable printing paste and curing the paste by backing. In a separate soldering step a component is soldered to the lower conductors whereby the amount of solder as well as the soldering areas are delimited.

Another method is known from U.S. Pat. No. 4,961,886. In this known method use is made of a material which will be cured under influence of radiation, for instance ultraviolet radiation, electron beam radiation, or radiation in the visible part of the spectrum. By means of screening means and focusing means care is taken that initially only a part of the carrier is irradiated, i.e. the part where the dam has to be built. Thereafter the encapsulating material is poured onto the carrier at a location within the dam. As soon as the material reaches the position of the dam it will be cured at least partly under the influence of the present radiation and in that way will form the dam. Within the dam initially the material is not cured. As soon as the dam is formed also the area within the dam is irradiated and the whole material is cured.

This prior art method has a number of disadvantages. In the first place this method can only be. applied in combination with an encapsulating material which cures under the influence of radiation. Because of that the choice of the encapsulating material is relatively restricted. A further disadvantage relates to the fact that rather complicated focusing and screening measures are necessary to assure that the radiation from the radiation source will only irradiate that part of the carrier where the dam has to be formed. A further disadvantage relates to the fact that the pouring channel, through which channel the encapsulating material is poured onto the carrier, forms a hindrance for correctly radiating those parts of the carrier where the dam has to be formed. In U.S. Pat. No. 4,961,886 various solutions for this problem are indicated, all of them, however, necessitating additional measures and making therefore the necessary apparatus more complicated.

A method showing a lot of resemblance with the one discussed in the preceding two paragraphs is described in EP-0319175. Curable resin material is poured onto a substrate. A predefined section of the substrate, more specifically the section were the chip is positioned, is irradiated by a suitable source and as soon as the poured resin material reaches the irradiated section the material is cured and a dam is forced around the chip. Thereby the central part of the chip inside the dam is not encapsulated to enable for instance chemical detection by means of a chemically active part of the chip.

SUMMARY OF THE INVENTION

The object of the invention is now to indicate how the method defined in the first paragraph for encapsulating a chip on a carrier using the formation of a dam can be realized cheaper and simpler.

In agreement with said object the invention now provides a method with the characteristic that in the first separate step on the carrier only the dam is formed from a thermohardening material at a relatively high temperature and is cured at least partly and that in a succeeding second step the space within the dam is filled with the same thermohardening material at a relatively low temperature.

By using a relatively high temperature in the first step the thermohardening material will rather quickly be cured, at least partly, and will form a dam of sufficient strength. In the second step the space within the dam is filled at a relatively low temperature, so that the material within the dam at least initially will be fluid and will therefore have the opportunity to flow out uniformly and fill the whole space within the dam equally.

Preferably the method is carried out in such a manner that in a further third step the obtained encapsulated structure, is cured at a third temperature. Depending on the applied encapsulating material said third temperature is preferably selected such that both the wall as well as the material within the wall will be cured uniformly and preferably tensionless.

Although there are various methods to apply thermohardening material at a desired position on a carrier it is preferred that for the formation of the dam use is made of a first volumetric dispenser dispensing the thermohardening material. Suitable volumetric dispenser units are known as such. Within the possible range of apparatuses it is preferred that the first volumetric dispenser comprises a dispensing mouth which can be moved in two mutually perpendicular directions at some distance above the carrier such that a strip of material with the width and height of the dam can be dispensed.

With relation to the applied temperatures it is preferred that the temperature during the first step is selected depending on the applied thermohardening material such that the material, which is applied in the shape of a dam, after flowing out of the dispensing mouth shows no or only a small amount of shape alteration. Preferably both the carrier as well as the direct surroundings thereof have the desired temperature.

During the second step preferably both the carrier as well as the direct surroundings thereof have the desired relatively lower temperature.

In both steps it is furthermore preferred to take measures, if necessary, to prevent curing of the encapsulating material within the dispensing mouth of the dispensing unit. Such (cooling) measures are, however, known as such.

BRIEF DESCRIPTION OF THE DRAWINGS

The invention will now be described in more detail with references to the attached drawings.

FIG. 1a shows the first of four successive stages in the an encapsulating process according to the invention wherein a chip is positioned on a strip-type carrier.

FIG. 1b shows a second stage of the encapsulating process wherein a dam has been formed around the chip.

FIG. 1c shows a third stage of the encapsulating process wherein the dam has been filled with encapsulating material.

FIG. 1d shows a fourth stage of the encapsulating process wherein the encapsulated chip has been cured.

FIG. 2 shows an upper view on a carrier, as said carrier passes various processing stations, in which the method steps according to the invention are carried out.

FIG. 1 shows in four views 1a . . . 1d a number of succeeding method steps according to the invention.

DETAILED DESCRIPTION OF THE INVENTION

FIG. 1a shows a cross sectional view through a strip-type carrier 12 onto which a chip 10 is positioned. Through a number of bonding wires, two of which indicated by 14a and 14b are visible in the figure, the chip is connected to the conducted pattern which is present onto or into the carrier 12.

In a first method step a dam is built on the carrier 12 around chip 10. Therefore use is made of a so-called volumetric dispenser, dispensing a strip of material on the plate 12 of which the thickness is adjustable. The applied material is thermohardening and is applied at such a relatively high temperature of the carrier and the direct surroundings thereof that the strip after leaving the dispensing mouth will cure relatively fast at least partly and will form on the plate 12 a dam of which the dimensions will not significantly change anymore. In FIG. 1b two parts of the dam are indicated by 16a and 16b. The chip 10 is completely surrounded by the dam. The dam may have a round, rectangular, or other shape. To be able to form a dam of the required shape it is preferred that the first volumetric dispenser comprises a dispensing mouth which can be moved in two mutually perpendicular directions at some distance above the carrier by means if which a strip of material with the width and height of the dam can be dispensed.

After applying the dam 16, again. using a volumetric dispenser, the space within the dam is filled with a thermohardening material, preferably the same thermohardening material as was used for the dam. During this step, however, a lower temperature is applied so that the material to a large extent stays fluid and will fill the space within the dam uniformly such that the chip 10 and the wires 14 are completely embedded. FIG. 1c illustrates a cross section through the situation at the end of this step. During this step a volumetric dispenser can be applied of which the dispensing mouth is at a fixed position.

The intermediate product obtained in this manner is conveyed through an oven in which a temperature is maintained such that both the dam 16 as well as the filling material 18 therein are uniformly and tensionless cured until finally a complete and in a sense tensionless uniform encapsulation 20 around the chip 10 and above the carrier 12 is realized.

FIG. 2 illustrates how an elongated film, comprising a number of chips 10, can be encapsulated in various processing stations within the scope of the invention. The film-shaped carrier 12 is moving into the direction of the arrow 14 (in the figure from left to right) along a number of processing stations. Departing from a situation in which the chips in a non further elucidated manner are positioned on the carrier 12, whereby the necessary bonding wires 14, which in FIG. 2 do not carry separate reference numbers, are attached (bonded) to a conductor patterns present in or on the carrier 12.

Within a zone 30 a first volumetric dispenser is installed for applying a strip-shaped or rod-shaped dam onto the carrier 12. Suitable dispensers for dispensing a strip of material with suitable dimensions and comprising a dispensing mouth which can be moved at least in two mutually perpendicular directions above the carrier 12 such that a dam of the desired shaped can be dispensed on the carrier 12 are known as such. As is indicated schematically in FIG. 2 within the zone 30 by means of such a disperser a dam 16 is applied around the chip 10. This dam may have in general a rectangular shape as indicated in FIG. 2, but also other shapes such as a round or oval dam or a rectangular dam with chamfered edges are conceivable within the scope of the invention. The temperature within the zone 30 is maintained at a relatively high value such that the material of the dam 16 will cure at least partly, in any case to such an extent dat the dam as such will stay.

After further conveying the carrier 12 into the direction of the arrow 40 the chip surrounded by the dam 16, will reach the zone 32, in which a second dispenser is installed. By means of this second dispenser the space within the dam 16 is filled with thermohardening material 18. Preferably the same material is used as the material in de dam 16. The temperature within the zone 32 is significantly lower than the temperature within the zone 30 with the result that the material 18 will uniformly and equally flow and will fill the space within the dam 16 completely. Therewith a good encapsulation of the chip 10 is realized.

The carrier 12 is conveyed further and the now encapsulated chip will reach the zone 34 in an oven 22 in which a temperature is maintained such that during the passage of this oven the material 16, 18. is cured completely, uniformly and with any tension such, that after leaving the oven the encapsulation 20 on the carrier 12 has obtained its final cured state.

Thereafter the separate encapsulated chips with corresponding section of the carrier can be separated from each other and processed any further, for instance installed on a credit card, etc.

What is claimed is:

1. A method for encapsulating a chip on a carrier comprising:
   a) positioning the chip on the carrier;
   b) forming a dam around the chip on the carrier employing a volumetric dispenser, the dam being formed from a thermosetting material at a first temperature providing at least partial curing of the thermosetting material; and
   c) subsequently to forming the dam, pouring a thermosetting material into the space within the dam to encapsulate the chip, the thermosetting material being at a second temperature being a temperature lower than the first temperature;

wherein the volumetric dispenser comprises a dispensing mouth positioned above the carrier and movable in two mutually perpendicular directions relative to the carrier to dispense a strip of material having the width and height of the dam and wherein the resulting encapsulated structure is cured to harden the encapsulating material.

2. A method according to claim 1 wherein the thermosetting material poured into the dam is the same material as is employed for dam forming.

3. A method according to claim 1 wherein the carrier is maintained at said first temperature during dam forming.

4. A method according to claim 3 wherein the first temperature is such that the dam material cures quickly to form a dimensionally stable dam.

5. A method according to claim 1 wherein the carrier is maintained at said second temperature during chip encapsulation.

6. A method according to claim 5 wherein the second temperature is such that the thermosetting material will flow to uniformly fill the space within the dam.

7. A method according to claim 1 further comprising effecting the curing of the encapsulated structure at a third temperature.

8. A method according to claim 1 wherein the curing of the encapsulated structure is effected at a temperature selected according to the thermosetting material or materials employed, said curing temperature being maintained so that the dam and the encapsulating material are cured in a uniform and stress-free manner.

9. A method according to claim 1 wherein the volumetric dispenser is adjustable to adjust the thickness of the dispensed strip of material.

10. A method according to claim 1 comprising employing a further volumetric material dispenser to dispense the chip encapsulation material, the further volumetric dispenser having a fixed-position dispensing mouth.

11. A method according to claim 1 wherein during dam forming only the dam is formed and wherein the dam is filled with the thermosetting material.

12. A method according to claim 1 wherein bonding wires connected to the chip are present within the dam and are also encapsulated.

13. A method according to claim 1 wherein the thermosetting material poured into the dam is the same material as is employed for dam forming, wherein the carrier is maintained at said first temperature during dam forming and at said second temperature during chip encapsulation, said first temperature being such that the dam material cures quickly to form a dimensionally stable dam and said second temperature being such that the thermosetting material will flow to uniformly fill the space within the dam, and wherein the method further comprises effecting the curing of the encapsulated structure at a third temperature to provide a uniformly cured stress-free product.

14. A method according to claim 1 wherein the thermosetting material poured into the dam is the same material as is employed for dam forming, wherein the carrier is maintained at said first temperature during dam forming and wherein the carrier is maintained at said second temperature during chip encapsulation.

15. A method according to claim 1 wherein the chip is provided with bonding wires and wherein the dam is formed on the carrier around the chip and bonding wires.

* * * * *